United States Patent
Arai et al.

(10) Patent No.: US 7,234,476 B2
(45) Date of Patent: Jun. 26, 2007

(54) METHOD OF CLEANING CVD EQUIPMENT PROCESSING CHAMBER

(75) Inventors: Hirofumi Arai, Tama (JP); Hideaki Fukuda, Tama (JP)

(73) Assignee: ASM Japan K.K., Tokyo (JP)

( * ) Notice: Subject to any disclaimer, the term of this patent is extended or adjusted under 35 U.S.C. 154(b) by 327 days.

(21) Appl. No.: 10/385,984

(22) Filed: Mar. 10, 2003

(65) Prior Publication Data

US 2003/0170402 A1  Sep. 11, 2003

(30) Foreign Application Priority Data

Mar. 11, 2002  (JP) .............................. 2002-065304

(51) Int. Cl.
*B08B 9/093* (2006.01)
(52) U.S. Cl. .................. 134/22.18; 134/1.1; 134/22.1; 134/31; 134/902; 438/905; 156/345.47
(58) Field of Classification Search ................. 134/1.1, 134/22.1, 902, 22.18, 31; 216/67; 438/905; 439/905
See application file for complete search history.

(56) References Cited

U.S. PATENT DOCUMENTS 5,709,757 A * 1/1998 Hatano et al. ........... 134/22.14
5,788,778 A * 8/1998 Shang et al. .................... 134/1
6,374,831 B1 * 4/2002 Chandran et al. ............ 134/1.1
6,432,255 B1 * 8/2002 Sun et al. ................. 118/723 E
2002/0062837 A1 * 5/2002 Miyanaga et al. ............. 134/1

FOREIGN PATENT DOCUMENTS

JP  06-097154  4/1994
JP  10-149989  6/1998

OTHER PUBLICATIONS

H. Pierson. Handbook of Chemical Vapor Deposition (CVD). Noyes Publications, 1992. pp. 150, 248).*

* cited by examiner

*Primary Examiner*—M. Kornakov
(74) *Attorney, Agent, or Firm*—Knobbe, Martens Olson & Bear LLP

(57) ABSTRACT

A method of remote plasma cleaning a processing chamber of CVD equipment, which has high cleaning rates, low cleaning operational cost and high efficiency, is provided. The method comprises supplying cleaning gas to the remote plasma-discharge device; activating the cleaning gas inside the remote plasma-discharge device; and bringing the activated cleaning gas into the processing chamber and which is characterized in that a mixed gas of $F_2$ gas and an inert gas are used as the cleaning gas. A concentration of the $F_2$ gas is 10% or higher. The $F_2$ gas, which is a cleaning gas, is supplied to the remote plasma-discharge device from an $F_2$ gas cylinder by diluting $F_2$ gas at a given concentration by an inert gas.

9 Claims, 3 Drawing Sheets

METHOD OF CLEANING CVD EQUIPMENT PROCESSING CHAMBER

BACKGROUND OF THE INVENTION

1. Field of the Invention

The present invention relates to a method of cleaning inside the processing chamber of CVD equipment used for semiconductor manufacturing. The invention particularly relates to a method of cleaning inside the processing chamber employing a remote plasma.

2. Description of the Related Art

In CVD (Chemical Vapor Deposition) equipment used for semiconductor manufacturing or deposition equipment including sputtering equipment, if deposition onto an object to be processed (e.g., a semiconductor wafer) is performed continuously, deposits adhere to internal walls of a processing chamber, etc. other than the object to be processed. When the deposits exfoliate, they cause particle contamination in a deposition process, resulting in wiring malfunction of devices such as DRAM or deposition failure. Consequently, it is required to clean inside a processing chamber with a given cycle.

Up to now, as disclosed in Japanese Patent Laid-open No.1994-97154, a method of bringing gas containing PFC (Perfluoro-compound) such as $CH_4$, $C_2F_6$, $C_3F_8$, $CHF_3$, $SF_6$, $NF_3$, etc. as cleaning gas into a reaction chamber, generating reaction active species (mainly fluorine radicals) by exciting the cleaning gas into plasma by applying high-frequency power to upper/lower electrodes, and removing deposits inside the reaction chamber by gaseous decomposition (in-situ cleaning) has been used.

In the case of the in-situ cleaning, however, because plasma is generated by applying high-frequency power to the upper electrode, which is used during a deposition process, ion collision is caused by charged particles generated in a space between the upper electrode and a susceptor which is the lower electrode. As a result, sputtering of a surface of the upper electrode is caused, resulting in problems such as by-product generation and electrode damage. Additionally, gaseous species containing PFC have an extremely high global warming potential (=infrared absorption factor x the duration of the atmosphere), long-range effects on the earth are feared.

To solve these shortcomings, a remote plasma cleaning method, in which plasma is excited outside a reaction chamber and cleaning gas is activated in the reaction chamber, was developed. In this method, $NF_3$ is mainly used as cleaning gas; $NF_3$ is dissociated and activated inside the remote plasma-discharge device; reaction active species generated in the device are brought into the reaction chamber to decompose and remove deposits adhering on inner walls, etc.

In the case of remote plasma cleaning, because plasma is generated outside the reaction chamber, only electrically-neutral atoms and molecules are brought into the reaction chamber and charged particles are not brought in. Consequently, because cleaning inside the reaction chamber is achieved only by chemical reactions, it is possible to prevent physical damage to electrodes.

On the other hand, because capacity inside the reaction chamber has been increasing as diameters of objects to be processed have become larger in recent years, removing deposits from inner walls, etc., which are remote from a plasma-generating area, becomes difficult and time required for cleaning tends to increase. If cleaning time increases, processing time per unit number of pieces of objects to be processed increases, directly leading to lowering of device throughput.

Additionally, as disclosed in Japanese Patent Laid-open No.1998-149989, if a plasma output value applied, which is used for a remote plasma cleaning discharge device, is in the range of 500 to 1500 W, supply gas is not decomposed completely. If supply gas not decomposed by plasma is discharged, there is the risk of having an adverse effect on the environment. Consequently, it is required to activate supply gas using approximately 3.0 to 12 kW output so that the supply gas is completely dissociated. In terms of device operational cost, however, effective cleaning using an output of 3.0 kW or lower is desired.

To solve these problems, accelerating cleaning rates and promoting efficiency accommodating large-capacity reaction chambers are required. The inventors of the present invention focused attention on cleaning gas, which had a decisive influence on promoting efficiency of cleaning. It is fluorine radicals that make a large contribution to reaction chamber cleaning, and increase in an amount of fluorine radicals to be generated is thought to directly lead to improvement of cleaning rates. It is not to say, however, that gas species whose amount to be generated is larger are simply good, but it is to say that gas species are dirable, which can dissociate deposits with less energy as compared with conventional $NF_3$, etc. (i.e., an amount of fluorine radicals to be generated per unit energy is large) and with which gas cost calculated from a gas amount required per unit number of objects to be processed is low. A gas which can most satisfy these conditions is $F_2$, which comprises two fluorine atoms. Gas cost per unit volume of this $F_2$ gas is exceedingly less expensive as compared with $NF_3$.

Consequently, the object of the present invention is to provide a remote plasma cleaning method for cleaning a reaction chamber of CVD equipment at high cleaning rates.

The second object of the present invention is to provide a remote plasma cleaning method with low cleaning operational cost and high efficiency.

The third object of the present invention is to provide a remote plasma cleaning method which is environmentally friendly and has least impact on global warming.

SUMMARY OF THE INVENTION

To achieve the above-mentioned objects, a method according to the present invention comprises the following processes:

The method of remote plasma cleaning inside a processing chamber of CVD equipment using a remote plasma-discharge device comprises a process of supplying cleaning gas to the remote plasma-discharge device, a process of activating the cleaning gas inside the remote plasma-discharge device and a process of bringing the activated cleaning gas into the processing chamber, and which is characterized in that a mixed gas of $F_2$ gas and an inert are used as the cleaning gas.

Preferably, a concentration of the $F_2$ gas is 10% or higher.

Preferably, the process of bringing cleaning gas into the remote plasma device includes supplying $F_2$ gas from an $F_2$ gas cylinder by diluting $F_2$ gas at a given concentration by an inert gas.

As a modified version, the process of bringing cleaning gas into the remote plasma-discharge device includes a process of supplying $F_2$ gas at a given concentration by mixing an inert gas supplied from an inert gas cylinder and high-purity $F_2$ gas generated by an $F_2$ generator.

Specifically, the preferred inert gas is He or Ar.

Further preferably, the CVD equipment is plasma CVD equipment, which has upper and lower electrodes inside the processing chamber, and the method further includes a process of selecting the lower electrode so that a value obtained by dividing a surface area of the lower electrode by an surface area of a wafer is in the range of 1.08 to 1.38, a process of selecting the upper electrode so that a value obtained by dividing a surface area of the upper electrode by a surface area of the lower electrode is in the range of 1.05 to 1.44, and a process of controlling an upper electrode temperature to be at 200° C. to 400° C.

EXPLANATION OF SYMBOLS USED

Figure 1:
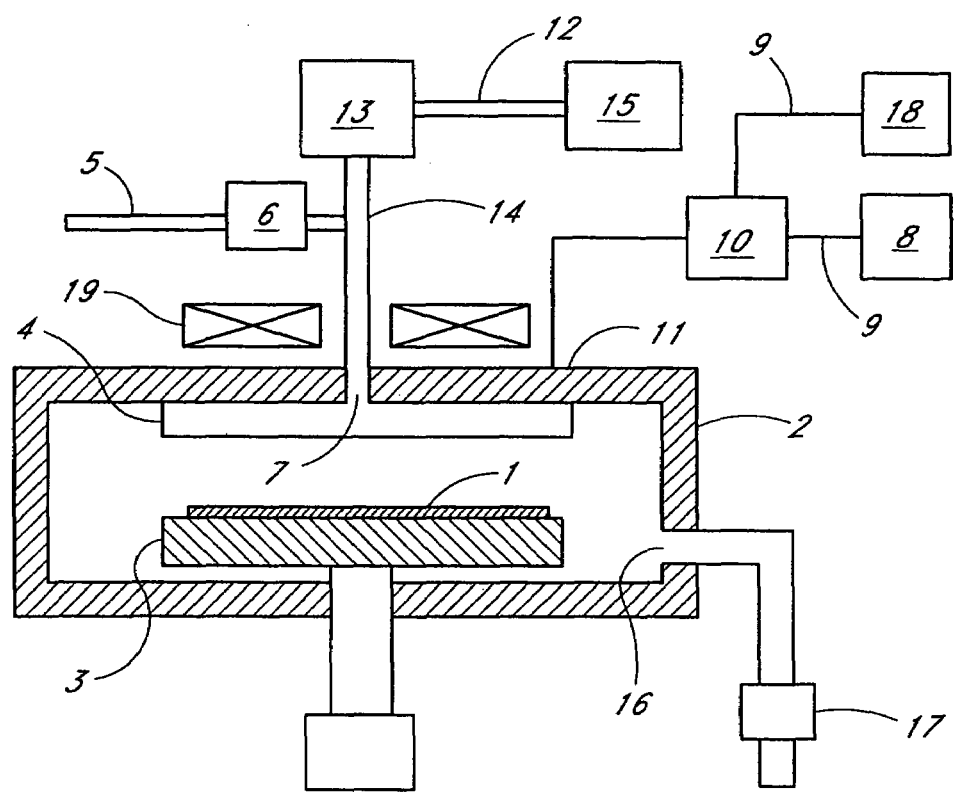
FIG. 1 shows a schematic view of a system incorporating a remote plasma-discharge device in conventional plasma CVD equipment.

1 Object to be processed
2 Reaction chamber
3 Susceptor
4 Shower head
5 Line
6 Valve
7 Upper-side opening
8 High-frequency power source
9 Output cable
10 Matching circuit
11 Top of the reaction chamber
12 Line
13 Remote plasma-discharge device
14 Line
15 Cleaning supplying means
16 Exhaust port
17 Conductance regulating valve
18 High-frequency power source
19 Heater

DETAILED DESCRIPTION OF THE INVENTION

The present invention is described in detail by referring to figures. FIG. 1 shows a schematic view of a system in which a remote plasma-discharge device is connected with a parallel-flat-plate type of plasma CVD equipment. An object to be processed 1 (typically, a semiconductor wafer) is placed on a lower electrode which also serves as a susceptor 3, which is set up inside a reaction chamber and which includes ceramic or aluminum alloy resistance-heating type heater in it. After reaction gas, which forms a thin film on a surface of the object to be processed 1, is controlled at a given flow rate, it is supplied to an upper electrode, which also serves as a shower head 4, from a line 5 via a valve 6 and through an upper opening 7 of the reaction chamber. On the upper side of the shower head 4, a heater 19 is set up and controls a temperature of the upper electrode which also serves as the shower head 4 at a given temperature. To supply high-frequency power to excite the reaction gas brought into the reaction chamber 2 into plasma, high-frequency power sources (8, 18) are connected to the upper side 11 of the reaction chamber 2 through an output cable 9 and via a matching circuit 10. As the high-frequency power sources, power sources of two different high-frequency types, a power source of 13.56 MHz and a power source of 430 kHz are used to improve film quality controllability. After thin film formation processing is completed, the reaction gas is exhausted by a vacuum pump (not shown) from an exhaust port via a conductance regulating valve.

After deposition processing onto a given number of objects to be processed 1 is completed, cleaning of deposits remaining inside the reaction chamber 2 is conducted by a remote plasma cleaning device. The remote plasma cleaning device comprises a cleaning gas supplying means 15 and a remote plasma-discharge device 13. The cleaning gas supplying means 15 is connected to the remote plasma-discharge device 13 through a line 12. The remote plasma-discharge device 13 is connected to the upper-side opening 7 of the reaction chamber 2 through a line 14. A control valve can be attached in the middle of the line 14. Suitable remote plasma-discharge devices are identified as ASTRON® AX7651 and ASTRON iAX760 by MKS.

In the present invention, as described below, $F_2$ is used as cleaning gas. By using $F_2$, reaction active species which are outputted from the remote plasma-discharge device 13 comprise only fluorine radicals, eliminating products unnecessary for cleaning purpose. Additionally, because bonding/dissociation energy (155 kJ/mol) between $F_2$ molecules is extremely low as compared with bonding/dissociation energy of $NF_3$ (828 kJ/mol), energy required for generating the same amount of fluorine radicals can be reduced. As a result, an amount of fluorine radicals to be generated per unit energy of the remote plasma-discharge device 13 is significantly increased, directly leading to speeding up of cleaning rates. In other words, because energy consumed for gas dissociation for obtaining the same output of fluorine radicals is significantly reduced as compared with conventional $NF_3$, etc., it becomes possible to reduce running costs of the plasma CVD equipment. Further, in the atmosphere, $F_2$ immediately changes to HF by reacting to vapor and its life time in the atmosphere is close to zero. Because its global warming potential is extremely low, the effect on the global environment can be considerably mitigated.

Figure 2A:
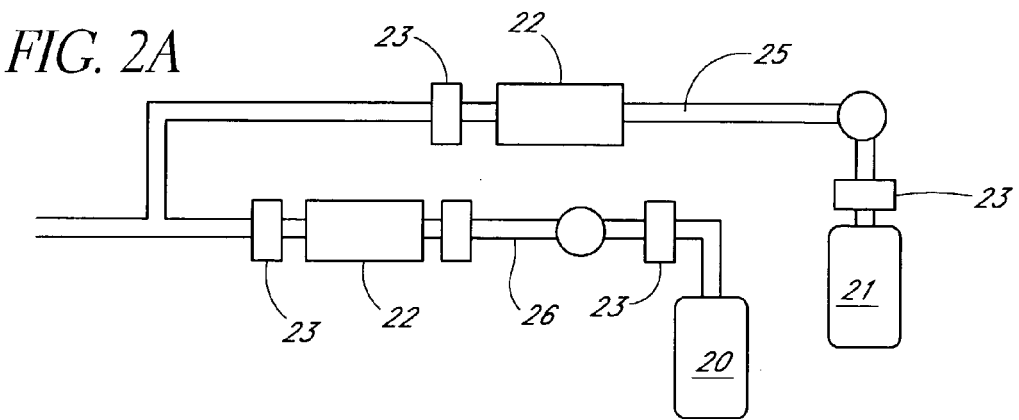
FIG. 2a shows a schematic view of one embodiment of the cleaning gas-supplying means according to the present invention.

FIG. 2 shows a preferred embodiment and other embodiments of the cleaning gas-supplying means 15. As shown in FIG. 2a, the cleaning gas-supplying means 15 preferably includes a gas cylinder 20 filled with $F_2$ which is diluted by Ar gas to volume concentration of 20%. Because $F_2$ has high reactivity, from a safety point of view, it is difficult to fill $F_2$ with 100% concentration when supplying from the cylinder. For this reason, $F_2$ diluted by an inert gas to volume concentration of 20% is current critical concentration for cylinder filling. As an inert gas, He can be used in addition to Ar. On an $F_2$ gas-supply line 26, a valve 23 and a mass flow controller 22 are set up. The cleaning gas-supplying means 15 can further include an inert gas supply cylinder 21. The inert gas supply cylinder 21 is preferably an Ar cylinder. An He cylinder also can be used. An inert gas supply line 25 is set up separately from the $F_2$ gas-supply line 26. On the inert gas supply line 25, a valve 23 and a mass flow controller 22 are set up.

Figure 2B:
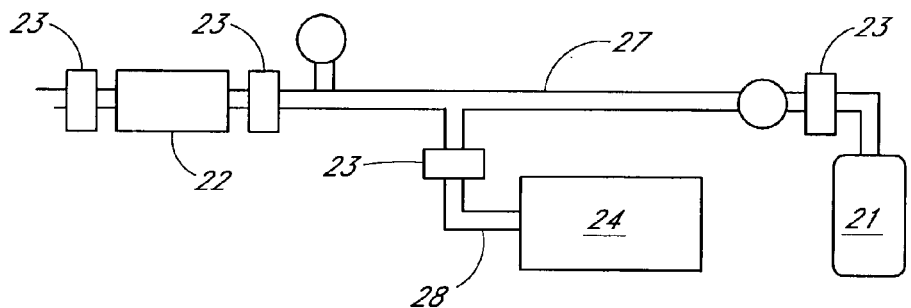
FIG. 2b shows a schematic view of another embodiment of the cleaning gas-supplying means according to the present invention.

FIG. 2b shows another embodiment of the cleaning gas-supplying means 15 for supplying high-concentration $F_2$ gas. High-purity $F_2$ gas is generated by an $F_2$ generator 24. The $F_2$ generator 24 generates $F_2$ by electrolyzing HF in an electrolysis bath. In this process, high-purity $F_2$ and $H_2$ are generated, and a system is provided directly to supply $F_2$ to the reaction chamber 2 and to exhaust $H_2$ respectively. Additionally, this system can supply $F_2$ to one or more reaction chambers according to need. (A suitable $F_2$ generator is identified as MicroGen™ and manufactured by Fluorine On Call, Ltd, or Generation-F™/BOC EDWARDS.) On an upstream portion of the $F_2$ generator 24, an inert gas supply cylinder 21 is set up. The inert gas supply cylinder 21 is connected with a mass flow controller 22 through a line 27 and via a valve 23. The $F_2$ generator 24 is connected to the line 27 between the inert gas supply cylinder 21 and the mass flow controller 22 through an $F_2$ gas supply line 28 and via a valve 23. The $F_2$ gas supply line 28 is manufactured of Teflon®, which is a resin material having corrosion resistance against $F_2$.

Figure 2C:
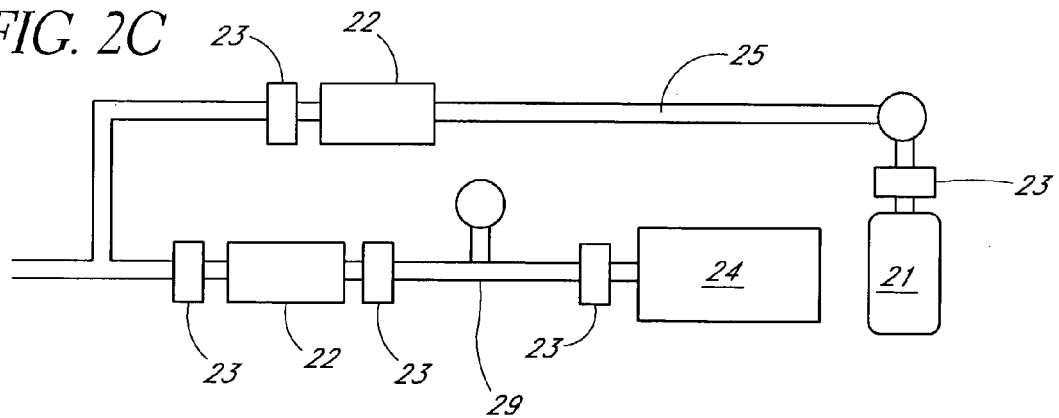
FIG. 2c shows a modified embodiment of the cleaning gas-supplying means according to the present invention.

FIG. 2c shows a modified embodiment of the cleaning gas-supplying mean shown in FIG. 2b. On the $F_2$ gas supply line 29 extending from the $F_2$ generator 24, a valve 23 and a mass flow controller 22 are set up. Separately from the $F_2$ gas supply line 29, an inert gas supply line 25 is set up. On the inert gas supply line 25, a valve 23 and a mass flow controller 22 are set up. A material used for the $F_2$ gas supply line 29 is the same as the one used for the $F_2$ gas supply line 28 shown in FIG. 2b.

The method of remote plasma cleaning a reaction chamber of CVD equipment according to the present invention is described below. The method concerned includes a process of supplying a mixed gas of $F_2$ gas and an inert gas to the remote plasma-discharge device 13 from the cleaning gas-supplying means 15. According to the preferred embodiment shown in FIG. 2a, $F_2$ gas diluted to volume concentration of 20% by Ar gas is supplied to the remote plasma-discharge device 13 from the gas fill cylinder 20 through the line 26 and via the valve 23 after its flow rate is controlled by the mass flow controller 22. Ar gas joins together with $F_2$ gas from an Ar 100% gas cylinder after its flow rate is controlled by the mass flow controller 22. By mixing Ar in the $F_2$ gas, $F_2$ gas concentration to be supplied to the remote plasma-discharge device 13 can be changed.

According to another embodiment shown in FIG. 2b, high-purity $F_2$ gas generated in the $F_2$ generator 24 is mixed with Ar gas supplied from the Ar 100% gas cylinder 21 set up on the upstream side through the line 28 and via the valve 23, is diluted at a given concentration, and is supplied to the remote plasma-discharge device 13 after its flow rate is controlled by the mass flow controller 22.

According to the modified embodiment shown in FIG. 2c, a flow rate of high-purity $F_2$ gas generated in the $F_2$ generator 24 is controlled by the mass flow controller 22 through the line 29 and via the valve. A flow rate of Ar gas from the Ar 100% gas cylinder 21 is controlled by the mass flow controller 22 through the line 25 and via the valve 23, and it joins together with $F_2$ gas. By mixing Ar gas with the $F_2$ gas, $F_2$ gas concentration to be supplied to the remote plasma-discharge device 13 can be diluted at a given concentration.

According to the cleaning gas-supplying means shown in FIGS. 2a–2c, $F_2$ gas with preferably 10% to 100% concentration can be supplied as shown in details below.

$F_2$ gas supplied from the cleaning gas-supplying means 15 to the remote plasma-discharge device 13 is dissociated and activated in the device.

After that, activated $F_2$ gas is brought in the opening 7 of the upper side 11 of the reaction chamber 2 through the line 14, distributed equally inside the reaction chamber 2 via the shower head 4. The activated $F_2$ gas reacts chemically with deposits adhering to reaction chamber inner walls, etc. to vaporize the deposits. The activated $F_2$ gas and products inside the reaction chamber 2 are exhausted by the vacuum pump (not shown) through the exhaust port 16 via the conductance regulating valve 17 to an external device for decomposing exhaust gas (not shown).

An evaluation experiment using the remote plasma cleaning method according to the present invention conducted is described below.

Experiment 1

Comparative experiments of conventional remote plasma cleaning using a mixed gas of $NF_3$ and Ar as cleaning gas and the remote plasma cleaning according to the present invention using a mixed gas of $F_2$ and Ar as cleaning gas were conducted.

For the comparative experiments, a system with the same configuration as shown in FIG. 1 was used. With conditions of a TEOS flow of 115 sccm, an $O_2$ flow of 1000 sccm, a reaction chamber pressure of 3.5 Torr, high-frequency power (13.56 MHz) at 315 w, high-frequency power (430 kHz) at 300 W, a gap distance of 10 mm, an upper electrode temperature of 130° C., a lower electrode temperature of 400° C., and a reaction chamber side-wall temperature of 120° C., a plasma oxide film was formed on a Ø200 mm silicon wafer. After deposition was completed, with conditions of an $NF_3$ flow of 1.0 slm, an Ar flow of 2 slm, a reaction chamber pressure of 5 Torr, a gap distance of 14 mm, an upper electrode temperature of 130° C., a lower electrode temperature of 400° C., and a reaction chamber side-wall temperature of 120° C., remote plasma cleaning of the reaction chamber 2 was conducted. As a method of detecting a cleaning end-point, a method of calculating a cleaning rate by detecting light emission of a substance ($SiF_4$, etc.) generated by a reaction of cleaning gas and remaining deposits in the plasma by a plasma emission spectroscopy analysis method and by determining a cleaning end-point from lowering of its emission intensity and change in plasma impedance was used.

A cleaning rate obtained when the above-mentioned conditions were used as the standard conditions was 1.14 μm/min., and power consumption of the remote plasma-discharge device at that point was 3.0 kW. When an $NF_3$ flow of 1.0 slm was supplied, an output of fluorine radicals discharged from the remote plasma-discharge device by 100% dissociation was 3.0 slm. From these results, under these conditions, it was found that an output of fluorine radicals discharged per unit consumption of the remote plasma-discharge device was $1.0 \times 10^{-3}$ mol/W. Additionally, gas cost required per wafer after a plasma oxide film of 1 μm was formed was approximately 62 yen/wafer.

A remote plasma cleaning experiment using the preferred embodiment according to the present invention is described below. A system with the same configuration as shown in FIG. 1 was used for the experiment with the preferred embodiment. With conditions of a TEOS flow of 115 sccm, an $O_2$ flow of 1000 sccm, a reaction chamber pressure of 3.5 Torr, high-frequency power (13.56 MHz) at 315 w, high-frequency power (430 kHz) at 300 W, a gap distance of 10 mm, an upper electrode temperature of 130° C., a lower electrode temperature of 400° C., and a reaction chamber side-wall temperature of 120° C., a plasma oxide film with a film thickness of 1 μm was formed on a Ø200 mm silicon wafer. Additionally, high-frequency power was adjusted so that a film stress of the plasma oxide film to be a fixed value of approximately −120 Mpa. After deposition was completed, $F_2$ with volume concentration of 20% (80% diluted by Ar), which was filled in the cylinder, was supplied to the remote plasma-discharge device 13 using the cleaning gas-supplying means 13 shown in FIG. 2a. At this point, the valve 23 of the gas line 25 was closed so that Ar gas was not supplied from the inert gas cylinder 21. Cleaning was conducted with conditions of a reaction chamber pressure of 5 Torr, a gap distance of 14 mm, an upper electrode temperature of 130° C., a lower electrode temperature of 400° C. and a reaction chamber side-wall temperature of 120° C. The experiment was conducted by altering a flow of $F_2$ gas with a concentration of 20% by the mass flow controller 22. Power consumption at this point of the remote plasma-discharge device 13 was measured using a clamp meter. Cleaning rates were measured in the same way as used for the comparative example.

Figure 3:
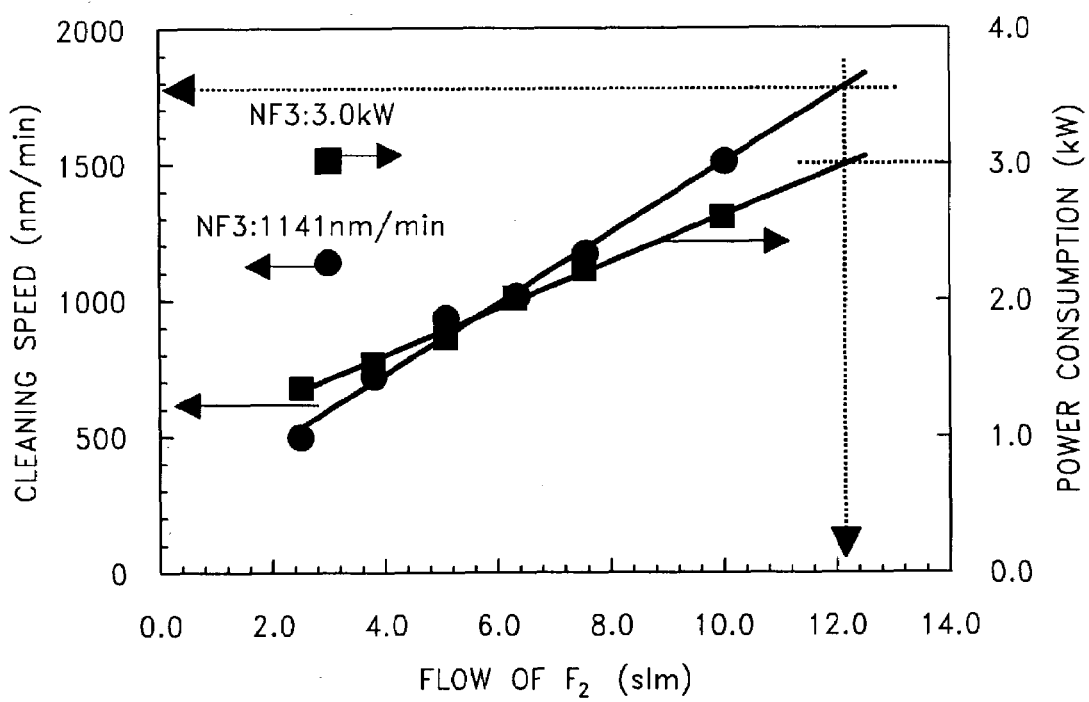
FIG. 3 is a graph showing a relation of cleaning rates and power consumption of a remote plasma-discharge device to flow change in 20% $F_2$ gas.

FIG. 3 is a graph showing relation of cleaning rates and power consumption of the remote plasma-discharge device 13 to the flow-rate change in 20% $F_2$ gas. In the graph, the cleaning rate and the power consumption in the comparative example with an $NF_3$ flow of 3 slm (including an Ar flow of 2 slm) is shown by one point.

It is known from the graph shown in FIG. 3 that both cleaning rates and power consumption of the remote plasma-discharge device are proportional to the flow-rate change in the 20% $F_2$ gas. It is known that power consumption when a flow rate of the 20% $F_2$ gas is the same flow rate (3 slm) as that of $NF_3$ in the comparative example significantly decreased by approximately 50% to approximately 1.5 kW from 3.0 kW obtained in the comparative example. Additionally, whereas an $NF_3$ flow which could be decomposed by power consumption at 3.0 kW of the remote plasma-discharge device 13 was 3 slm (an Ar flow of 2 slm), a flow of 20% $F_2$ which could be decomposed by power consumption at 3.0 kW of the remote plasma-discharge device 13 is assumed to be approximately 12 slm from the graph. Further, a cleaning rate obtained at that point is assumed to be approximately 1.75 μm/min. This indicates that a cleaning rate using 20% $F_2$ (Embodiment 1) when power consumption of the remote plasma-discharge device 13 is at 3.0 kW is improved by approximately 1.53 times as compared with a cleaning rate of 1.14 μm/min. using $NF_3$ (in Comparative example).

Fluorine radical output per unit energy when 12 slm of 20% $F_2$ was supplied was evaluated. A pure-$F_2$ flow when 12 slm of 20% $F_2$ was supplied was 2.4 slm. When the pure-$F_2$ is dissociated completely by the remote plasma-discharge device 13, a fluorine radical flow brought into the reaction chamber was 4.8 slm. Because power consumption of the remote plasma-discharge device at this point was 3.0 kW, it was known that fluorine radical output discharged per unit power consumption of the remote plasma-discharge device when 20% $F_2$ was used as cleaning gas was $1.6 \times 10^{-3}$ mol/W. This is 1.6 times higher output as compared with $NF_3$ in the comparative example. From this result, it was able to be demonstrated that increase in fluorine radical output was directly involved in improvement of cleaning rates.

Further, with a 20% $F_2$ flow of 12 slm and a cleaning rate of 1.75 μm/min., if gas cost consumed for cleaning was calculated for $F_2$ and Ar using separate unit cost respectively in the same way used for $NF_3$, cost was 40 yen/wafer, reducing the cost by approximately 35% from the comparative example. By using $F_2$ as cleaning gas, not only cleaning rates were improved, but also gas cost required per wafer after a plasma oxide film of 1 μm was formed was reduced, it became possible to significantly reduce device operational costs.

Experiment 2

According to the remote plasma cleaning method according to the present invention, an evaluation experiment of the relation between pure-$F_2$ concentration and cleaning rates was conducted. For this experiment, the preferred embodiment of the cleaning gas supplying means shown in FIG. 2a was used. In Experiment 2, by increasing only an Ar flow by releasing the valve 23 of the Ar gas cylinder 21, it was set up so that $F_2$ concentration was able to be controlled at 20% or lower without altering a pure-$F_2$ flow. Under the same deposition conditions as used in Experiment 1, a plasma oxide film of 1 μm was formed on a Ø200 mm silicon wafer. After deposition was completed, the silicon wafer was carried out from the reaction chamber. Cleaning was conducted. A flow of 20% $F_2$ (80% diluted by Ar) was stabilized at 12 slm (a pure-$F_2$ flow of 2.4 slm), which was the critical flow within power consumption of 3.0 kW in Experiment 1, and $F_2$ concentration was 20% when an Ar flow was at 0 slm. An Ar gas flow was controlled by the mass flow controller 22 at 4 slm for 15% $F_2$, 12 slm for 10% $F_2$ respectively. Other cleaning conditions which were the same as used for Experiment 1 were used.

Figure 4:
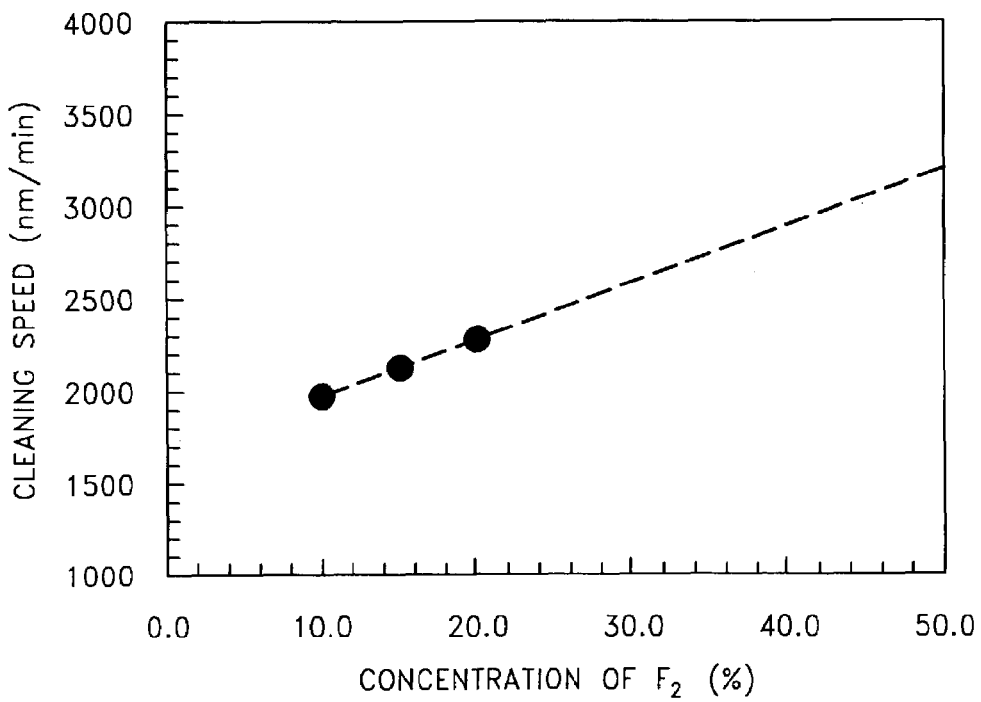
FIG. 4 is a graph showing change in cleaning rates for the reaction chamber when $F_2$ concentration is altered

FIG. 4 is a graph showing change in cleaning rates for the reaction chamber 2 when $F_2$ concentration was altered. It is seen that as $F_2$ is diluted by Ar at 20% or lower, cleaning rates decrease. In other words, $F_2$ concentration and cleaning rates are proportional. A pure-$F_2$ flow is constant, because the concentration is controlled here by changing a flow of Ar, which is a dilution gas. In other words, an output of fluorine radicals which are dissociated and activated by the remote plasma-discharge device and is brought into the reaction chamber 2 is also constant. Because it was known from Experiment 1 that cleaning rates increased proportionally to increase in an amount of fluorine radical output, it was known that using higher-purity $F_2$ was a contributing factor in further improving cleaning rates.

Although it is impossible to supply high-purity $F_2$ of 20% or higher by cylinder filling, it is assumed that cleaning rates can be improved up to approximately 3.19 μm/min. when 50% $F_2$ (Embodiment 2) is supplied according to other embodiments according to the present invention shown in FIG. 2b or FIG. 2c. This is approximately 2.8 times higher than the cleaning rate achieved using $NF_3$ in the comparative example. If gas cost required per wafer after a plasma oxide film of 1 μm is formed is calculated, the cost is 14 yen/wafer, making it possible to significantly reduce the cost by approximately 77% as compared with the comparative example. It was known that using higher-purity $F_2$ had multiplier effect on both improvement of cleaning rates and reduction in device operational cost. If assuming that only pure-$F_2$ (100%) was supplied from the $F_2$ generator shown in FIG. 2b and FIG. 2c without using a dilution gas Ar, a cleaning rate is assumed to be approximately 4.74 μm/min. Additionally, if gas cost required per wafer after a plasma oxide film of 1 μm is formed is calculated in the same way, the cost is exceedingly low 7.6 yen/wafer, which is significantly influenced by not using Ar, making it possible to reduce the cost by approximately 88% as compared with the comparative example. Table 1 summarizes experiment results when $NF_3$ was used as cleaning gas (Comparative example), 20% $F_2$ was used (Embodiment 1) and 50% $F_2$ was used (Embodiment 2).

|  | Cleaning Rate % [µm/min.] | Gas Cost % [yen/wafer] | Power Consumption % [kW] | F Output % [mol/W] |
| --- | --- | --- | --- | --- |
| Comparative example | 100 [1.14] | 100 [62] | 100 [3.0] | 100 [1.0 × 10⁻³] |
| Embodiment 1 | 154 [1.75] | 65 [40] | 100 [3.0] | 160 [1.6 × 10⁻³] |
| Embodiment 2 | 280 [3.19] | 22 [14] | 100 [3.0] | 160 [1.6 × 10⁻³] |

(Upper level: A comparative ratio in % with the comparative example treated as 100.
Lower level: Value obtained in the experiment)

It is seen that by using 50% $F_2$ as cleaning gas, the cleaning rate and device throughput has improved drastically.

Experiment 3

To further improve cleaning efficiency of the reaction chamber, an evaluation experiment by device hardware was conducted. As a device, parallel-flat-plate plasma CVD equipment for 300 mm wafer processing manufactured by ASM Japan (Dragon™212) was used, and later replaced by Dragon™2300. As to the equipment concerned, as disclosed in Japanese Patent Application No. 2001-361669, which is incorporated herein by reference, a lower electrode is selected so that a value of a surface area of the lower electrode divided by a surface area of a wafer is in the range of 1.08 to 1.38, an upper electrode is selected so that a value of a surface area of the upper electrode divided by a surface area of the lower electrode is in the range of 1.05 to 1.44, and an upper electrode temperature is controlled in the range of 200° C. to 400° C.

When the equipment concerned and conventional plasma CVD equipment for 300 mm wafer processing shown in FIG. 1 are compared, in-plane film thickness homogeneity and film stress are the same. Deposition speed, however, increases by approximately 7%, and in remote plasma cleaning under given conditions using $NF_3$ as cleaning gas, it has been demonstrated that cleaning rates were improved approximately threefold and a cleaning cycle was improved approximately fourfold.

Using the equipment concerned and supplying 20% $F_2$ (80% diluted by Ar) according to the preferred embodiment shown in FIG. 2a from a cylinder, cleaning of the reaction chamber was conducted. As a result, a cleaning rate of 5.25 µm/min., triple of the cleaning rate (1.75 µm/min.) obtained in Embodiment 1, was obtained. As the result of supplying 50% $F_2$ according to other embodiments shown in FIG. 2b and FIG. 2c, a cleaning rate of 9.57 µm/min., triple of the cleaning rate (3.19 µm/min.) obtained in Experiment 2, was obtained. By using the plasma CVD equipment concerned, cleaning rates were improved significantly as compared with conventional plasma CVD equipment, and efficiency of reaction chamber cleaning was able to be achieved.

Effects

According to the remote plasma cleaning method according to the present invention, cleaning rates for a reaction chamber of CVD equipment was able to be significantly improved.

According to the remote plasma cleaning method according to the present invention, device operational costs have been significantly reduced because dissociation of the cleaning gas by low energy in a remote plasma-discharge device has become possible and gas cost was lowered. As a result, semiconductor-processing equipment with high efficiency and high throughput was able to be brought to realization.

According to the remote plasma cleaning method according to the present invention, by using $F_2$ having low global warming potential, the risk of having an adverse effect on the global environment has been eliminated.

What is claimed is:

1. A method of cleaning a CVD processing chamber equipped with upper and lower parallel flat plate electrodes after processing a wafer, using a remote plasma-discharge device, comprising:
    selecting as the upper and lower electrodes a lower electrode having a surface area which is 1.08 to 1.38 times that of the wafer, and an upper electrode having a surface area which is 1.05 to 1.44 times that of the lower electrode;
    supplying a mixed gas of $F_2$ gas and an inert gas as a cleaning gas to the remote plasma-discharge device, wherein the mixed gas contains the $F_2$ gas at a concentration of 20% or higher;
    activating the cleaning gas inside the remote plasma-discharge device; and
    bringing the activated cleaning gas into the processing chamber while controlling the upper electrode at a temperature of 200° C. to 400° C.

2. The method as claimed in claim 1, wherein the process of supplying cleaning gas into the remote plasma device includes a process of supplying $F_2$ gas from a gas cylinder, which is filled with $F_2$ gas by diluting $F_2$ gas at a given concentration by an inert gas.

3. The method as claimed in claim 1, wherein the process of supplying cleaning gas into the remote plasma-discharge device includes a process of supplying $F_2$ gas diluted at a given concentration by mixing an inert gas supplied from an inert gas cylinder in high-purity $F_2$ gas generated by an $F_2$ generator.

4. The method as claimed in claim 1, wherein said inert gas is He or Ar.

5. The method as claimed in claim 1, wherein the cleaning gas inside the remote plasma-discharge device is activated at an output of fluorine radicals of about $1.6 \times 10^{-3}$ mol/W.

6. A method of cleaning a CVD processing chamber equipped with upper and lower parallel flat plate electrodes after processing a wafer, using a remote plasma-discharge device, comprising:
    selecting as the upper and lower electrodes a lower electrode having a surface area which is 1.08 to 1.38 times that of the wafer, and an upper electrode having a surface area which is 1.05 to 1.44 times that of the lower electrode;
    supplying a mixed gas consisting of $F_2$ gas and an inert gas as a cleaning gas to the remote plasma-discharge device, by supplying the $F_2$ gas from a gas cylinder which is filled with $F_2$ gas and diluting the $F_2$ gas at a given concentration by the inert gas upstream of the remote plasma-discharge device;
    activating the cleaning gas inside the remote plasma-discharge device; and
    bringing the activated cleaning gas into the processing chamber while controlling the upper electrode at a temperature of 200° C. to 400° C.

7. The method as claimed in claim 6, wherein the mixed gas contains the $F_2$ gas at a concentration of 20% or higher.

8. A method of cleaning a CVD processing chamber equipped with upper and lower parallel flat plate electrodes after processing a wafer, using a remote plasma-discharge device, comprising:

selecting as the upper and lower electrodes a lower electrode having a surface area which is 1.08 to 1.38 times that of the wafer, and an upper electrode having a surface area which is 1.05 to 1.44 times that of the lower electrode;

supplying a mixed gas consisting of $F_2$ gas and an inert gas as a cleaning gas to the remote plasma-discharge device, by supplying the $F_2$ gas diluted at a given concentration by mixing the inert gas supplied from an inert gas cylinder in $F_2$ gas generated by an $F_2$ generator, upstream of the remote plasma-discharge device;

activating the cleaning gas inside the remote plasma-discharge device; and bringing the activated cleaning gas into the processing chamber while controlling the upper electrode at a temperature of 200° C. to 400° C.

9. The method as claimed in claim 8, wherein the mixed gas contains the $F_2$ gas at a concentration of 50% or higher.

* * * * *